United States Patent [19]

Daubresse

[11] Patent Number: 4,639,835
[45] Date of Patent: Jan. 27, 1987

[54] DEVICE OBTAINED BY MOUNTING TWO SEMICONDUCTOR COMPONENTS WITHIN A SINGLE HOUSING

[75] Inventor: Francis Daubresse, La Mombralle Choisille, France

[73] Assignee: Thomson-CSF, Paris, France

[21] Appl. No.: 787,063

[22] Filed: Oct. 15, 1985

[30] Foreign Application Priority Data

Oct. 16, 1984 [FR] France ............................ 84 15817

[51] Int. Cl.⁴ .............................................. H05K 7/20
[52] U.S. Cl. ................................... 361/392; 361/386; 361/421; 174/52 PE
[58] Field of Search ..................... 174/52 PE, 16 HS; 361/380, 386–388, 421, 392, 395, 403, 405; 357/72, 75, 70, 81

[56] References Cited

U.S. PATENT DOCUMENTS

| | | | |
|---|---|---|---|
| 3,404,215 | 10/1968 | Burks | 174/52 PE |
| 3,539,884 | 11/1970 | Schaffner | 357/71 |
| 4,523,219 | 6/1985 | Heidegger | 357/75 |
| 4,532,538 | 7/1985 | Wurz | 357/75 |
| 4,538,168 | 8/1985 | Soerewyn | 361/388 |

Primary Examiner—G. P. Tolin
Attorney, Agent, or Firm—Oblon, Fisher, Spivak, McClelland & Maier

[57] ABSTRACT

The present invention concerns the mounting of two semiconductor components within a single or common housing. When two semiconductor components are always connected according to the same wiring diagram one presents them within a single housing in which their intrinsic connection has already been achieved. When one of the two components is produced from small-sized semiconductor chip the invention proposes replacing this first semiconductor chip by a wholly mounted component. Thereby it allows first of all to verify the integrity of this component and to dispose, furthermore, of an element whose dimensions now allow easy handling. This component is thus utilized in its finished state to replace one of the connections bridges of the electrodes of the second component to a pin of the housing in which this component must be installed. That means that in the manufacturing process of the second component, nothing is changed.

5 Claims, 2 Drawing Figures

DEVICE OBTAINED BY MOUNTING TWO SEMICONDUCTOR COMPONENTS WITHIN A SINGLE HOUSING

BACKGROUND OF THE INVENTION

1. Field of the invention

The invention concerns a process and a device for mounting two semiconductor components within a single housing. It also applies more particularly to the field of power semiconductors for use in switching operations: thryristors, triode AS semiconductor switches (triac) or power transistors.

2. Description of the prior art

Electronic circuits are already known, especially circuits associating a triode AS semiconductor switch or triac, to a diode AS switch or diac, in which the two components are always connected to each other according to a single wiring diagram. For various reasons, it is not always possible to integrate the two components upon a single semiconductor substrate. Each of the components is thus manufactured separately then encapsulated within its own box or housing. In a produced electronic circuit, each of these two components must thus be in turn plugged in. Doubling these plugging operations involves a loss of time and even of space if the implantation of the components is a delicate job. Since each of the semiconductor components is manufactured from different semiconductor chips, it has been envisaged to incorporate the two chips within a common or single box or housing. However, the two associated components, for example, a triac and a diac are seldom of comparable dimensions. The handling of the smallest component so as to approach it to the largest connection device is a delicate operation. Furthermore, in order to limit the possibility of rejection of the assembly, it is necessary to sort the chips in order to eliminate those which have flaws. This sorting, which is an electric sorting operation, is proportionally more difficult to carry out as the chips are much smaller, due to handling difficulties. Similarly, since a chip is not protected, its direct connections in the housing from another chip provoke a significant decrease in assembling efficiency: small chips deteriorate. The solution that consists of increasing the size of the small chip so that it is easier to handle is not economically viable. It needlessly provokes an increase in the amount of semiconductor material required.

SUMMARY OF THE INVENTION

The present invention aims at overcoming the drawbacks cited herein-above, by associating during the mounting operation, not two semiconductor chips, but one semiconductor chip and a whole component, including its housing. The whole component is that which corresponds to the small-sized chip. These two elements are thus inserted within the housing that was previously reserved solely for the large-sized chip.

The invention concerns a process and/or a device for mounting two semiconductor components within a single housing, this common or single housing having at least two output connector pins, a first one of which is electrically connected to a rear face of a first semiconductor chip to form a first component, this first chip furthermore comprising at least a first metallized zone upon its front face, wherein the second component is constituted by a semiconductor chip encapsulated within a sealed housing provided with two output electrodes, and wherein one of these electrodes is welded to the said first metallized zone whereas the other is welded to the second connector pin.

BRIEF DESCRIPTION OF THE DRAWINGS

The invention will become more apparent from reading the following description, given with reference to the appended figures, which are given solely by way of non-limitative illustration. In particular, these drawings in no way limit the invention to the triac/diac application represented therein. According to the appended drawings.

DETAILED DESCRIPTION OF THE INVENTION

Figure 1:
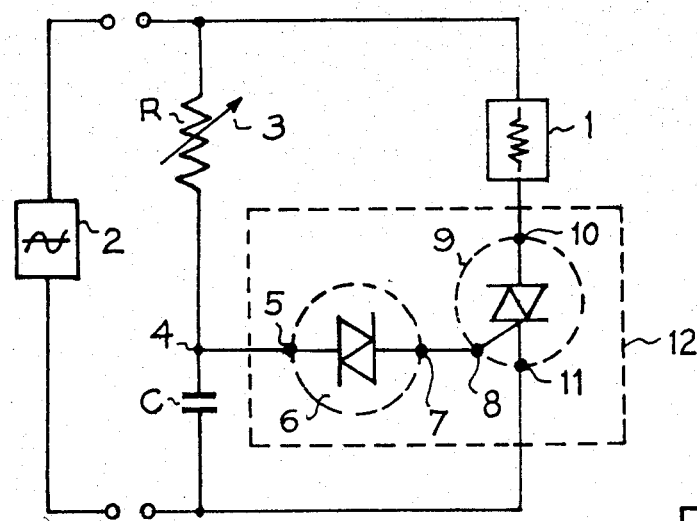
FIG. 1 represents an utilization example of a mounting structure according to the invention.

FIG. 1 represents an electronic circuit within which a load 1 is electrically delivered by an A.C. generator 2. In order to limit the amount of energy that is supplied in the load a control or adjustment 3 is made upon the time constant of a two-pole network R-C. The centre point 4 of this two-pole network is connected to a first electrode 5 of a diac 6. The other electrode 7 of this diac is connected to a trigger electrode 8 of a triac 9. This triac 9 is mounted in series with the load 1. The triac and the load are mounted in parallel, on the one hand, with the two-pole network R-C, and, on the other hand, with the generator 2. The triac is connected to the load 1 by a first main electrode 10 and it is connected to the generator 2 by its second main electrode 11. The circuit represented in FIG. 1 is widely utilized to adjust or control the speed of A.C. motors. The noteworthy feature of this circuit is that it comprises a mounting structure 12 of two semiconductor components that are always connected as shown in FIG. 1, i.e. that the electrode 7 of the diac 6 is always connected to the trigger 8 of the triac 9. It is thus convenient to carry out their mounting within the same housing.

Figure 2:
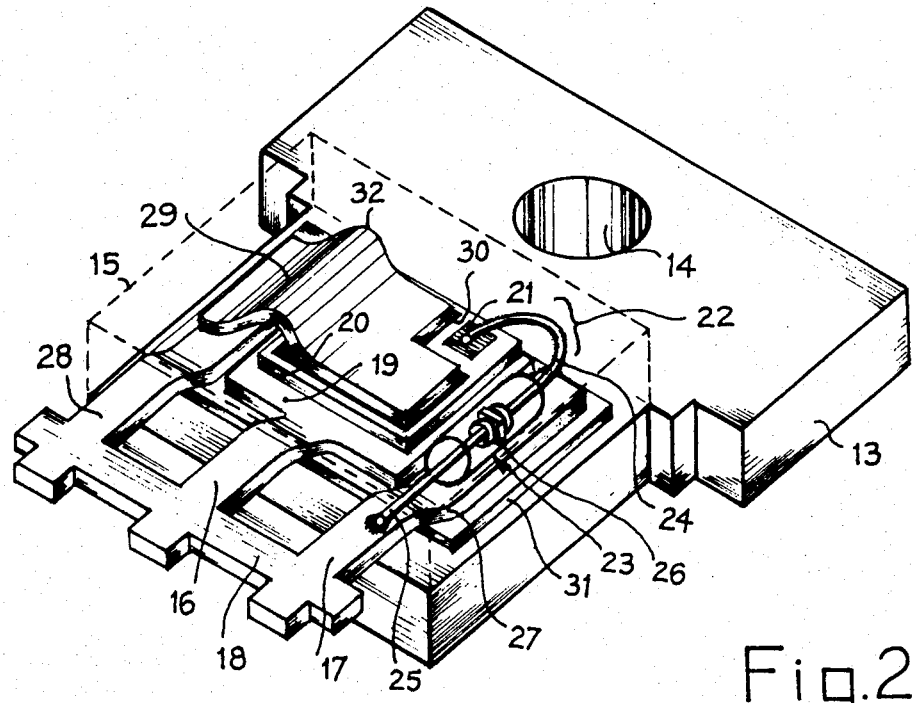
FIG. 2 represents the technological realization of the mounting structure according to the invention.

FIG. 2 represents the mounting of the two semiconductor components within a single housing according to the invention. The housing comprises a base plate 13 that acts as radiator. It is possibly coupled to a larger radiation through screw fixation in a circular opening 14. The components are disposed upon the base plate as will be described herein-below and are embedded within a thermo-hardening encapsulating resin 15. For enhanced simplicity, only the outline of this resin (in dashed lines) has been represented. The housing 13–15 comprises at least two output connector pins: pins 16 and 17. During insertion of the components or the chips, for greater handling ease, these pins are mechanically connected to each other by cross-pieces such as represented by element 18. After manufacturing has been completed, these cross-pieces are cut out in order to restore the electrical independence of the pins. A first pin 16 comprises a sheet 19 that is electrically connected to a rear face (concealed in the present figure) of a first semiconductor chip 20. The chip 20 in the example represented corresponds to the triac 9. The rear face represents a first electrode of this triac. This chip 20 furthermore comprises at least one first metallized zone 21 on its front face (here, the trigger of the triac).

One of the main features of the present invention is that the second semiconductor component 22 is constituted by a semiconductor chip 26 that is encapsulated within a sealed housing 23. The housing 23 is shown as a torn-away representation. The chip 26 corresponds to the dlac 6. This housing comprises two output electrodes: the electrodes 24 and 25. One of these electrodes, the electrode 24, is welded to the first metallized zone 21 whereas the other electrode, electrode 25, is welded to the second connector pin 17 of the housing 13–15.

The most serious problem which the present invention allows to overcome is that of assembling two semiconductor components. In fact, as the semiconductor chip 20 is large-sized, the semiconductor chip 26 is proportionally small-sized. It is furthermore that much smaller as the electronic function that it performs, the function of a diac, can be achieved by utilizing only a small surface of semiconductor material. In one example, the side of the semiconductor chip 26 is equal to about 0.5 mm. So that the chip 26 can be easily handled, it is necessary that its side measure at least 1.25 millimeter. The whole component presents, on the other hand, the advantage of being much larger and especially of possessing two output electrodes 24 and 25.

When the component 22 is not present within the housing 13–15, the metallized zone 21 is connected to the pin 17 by a conductor bridge. A second feature of the invention thus consists in replacing this bridge by the component 22. In fact, the putting into place of the bridges is a delicate operation; it implies handling precautions. These precautions are now applied in order to replace the bridge by the component 22. On the practical level, since the component 22 is so small (standardized housing DO-35), it requires the same space as a bridge. In any event, it is easily inserted within the triac housing (standardized housing TO-220, for example).

The housing 23 of the component 22 has a cylindrical shape. The electrodes 24 and 25 extend substantially therefrom along the axis, i.e. they are shifted in height with respect to the external generating lines of the housing 23. The purpose of this height shift is to simply connect the electrode 24 to the metallized zone 21. In fact, the housing 23 lies upon the end of the pin 17 in the same way that the chip 20 lies upon the sheet 19. The sheet 19 and the end of the pin 17 are substantially contained within the same plane. The height shift between the electrode 26 and the base of the housing 23 thus substantially corresponds to the thickness of the semiconductor chip 20. Consequently, it is only necessary to bend in the shape of a cross the electrode 24 so that it is applied upon the first metallized zone 21. The end of this cross is welded thereto. On the other hand, in order to set off this shift, the pins of the housing 13–15 comprise an S-shaped camber or curve 27. The effect of this camber is to bring the upper face of the pin 17 to about the height of the other electrode 25 of the component 22. The weldings of the two electrodes of the component 22 can thus be simply performed. They are absolutely comparable to the weldings that were carried out with the bridges in the prior art. All this means that the process for mounting the component 22 in the housing 13–15 can be carried out without the need of any supplementary operation.

In the example represented, the first semiconductor component is a triac. The housing 13–15 thus comprises a third pin 28 that is connected through the intermediary of a conductor bridge (metallic contact foil) 29 to a second metallized zone 30. This second zone 30 is also situated on the front face of the chip adjacent to the first zone 21. This first metallized zone 21 constitutes the access of the trigger of the triac; the second metallized zone of the front face corresponds to the second electrode of this triac. FIG. 2 again shows that any structure achieved is a stack structure. Above the base-plate 13 is disposed a ceramic plate 31 having the property of being a good conductor of heat while being electrically insulating. Above the plate 31 are disposed, in contact with said plate 31, the three pins 16, 17 and 28 of the triac device. The first semiconductor chip 20 topped by the metallic foil 29 is placed above the plate 19 of the central electrode 16. One end of this metallic foil or leaf 29 extends beyond the metallized surface 30; after a waving operation 32 in order to recover the height shift, this foil is connected upon the electrode 28. On the side opposite the electrode 28 with respect to the electrode 16 is disposed the electrode 17. Above this electrode 17 is placed the semiconductor component 22, as indicated herein-above.

The mounting according to the invention can be adapted to circuits other than those comprising a diac or a triac. For example, it can be adapted to those circuits comprising a thyristor and a read back diode. The mounting process according to the invention is, more particularly, able to be carried out when the first metallized zone is located at the periphery of the front face of the first semiconductor chip. It is however possible to foresee that this can be carried out, even if this first metallized zone was centrally disposed inside a second annular metallized zone.

In fact, since the second component is utilized instead of and in the same site as the bridge, nothing prevents it being connected to a central surface.

I claim:

1. Electronic component incorporating two semiconductor components within a common housing, this common housing having at least two outlet connector pins, one of which is electrically connected to a rear face of a first semiconductor chip in order to form a first component, this first chip furthermore comprising at least one first metallized zone on its front face wherein the second component is constituted by a semiconductor chip encapsulated within a sealed housing provided with two outlet electrodes and wherein one of these electrodes is welded to the said metallized zone whereas the other is welded to the second connector pin.

2. Component according to claim 1, wherein the first metallized zone is disposed at the periphery of the front face of the first chip.

3. An electronic component according to claim 1, wherein said outlet connector pins include a camber.

4. An electronic component according to claims 1 or 3, comprising:
said second semiconductor chip mounted upon a respective pin substantially on the same height as said first semiconductor chip is mounted on another of said pins.

5. An electronic component according to claims 1 or 3, wherein said first component comprises a triac, said second component comprises a diac, said first semiconductor chip comprises a second metallized zone, and a third pin is connected to said second metallized zone on the front surface of said first component.

* * * * *